United States Patent [19]

Sickler et al.

[11] Patent Number: 5,583,376
[45] Date of Patent: Dec. 10, 1996

[54] HIGH PERFORMANCE SEMICONDUCTOR DEVICE WITH RESIN SUBSTRATE AND METHOD FOR MAKING THE SAME

[75] Inventors: Janet Sickler, Georgetown; Everitt W. Mace, Hutto, both of Tex.

[73] Assignee: Motorola, Inc., Schaumburg, Ill.

[21] Appl. No.: 368,503

[22] Filed: Jan. 3, 1995

[51] Int. Cl.$^6$ ............................................. H01L 23/14
[52] U.S. Cl. ............................................. 257/702; 257/698
[58] Field of Search ............................ 257/702, 779, 257/780, 787, 781, 698, 786, 778, 701

[56] References Cited

U.S. PATENT DOCUMENTS

| | | | |
|---|---|---|---|
| 4,814,943 | 3/1989 | Okuaki . | |
| 5,216,278 | 6/1993 | Lin et al. | 257/688 |
| 5,325,583 | 6/1994 | Shimizu et al. | 29/849 |
| 5,371,404 | 12/1994 | Juskey et al. | 257/786 |
| 5,475,264 | 12/1995 | Sudo et al. | 257/758 |

Primary Examiner—Mahshid Saadat
Assistant Examiner—S. V. Clark
Attorney, Agent, or Firm—Patricia S. Goddard

[57] ABSTRACT

High performance semiconductor devices, such as those used to package microprocessor integrated circuits, demand materials with excellent electrical, physical and chemical properties. Polymethylpentene (PMP) compositions provide resin substrates for high performance devices with a material which has a low dielectric constant and a low dissipation factor. In addition, PMP has very low moisture absorption, and good mechanical stability under repeated thermal stress, which will help keep the device from cracking and warping during high temperature assembly processes and constant use.

14 Claims, 2 Drawing Sheets

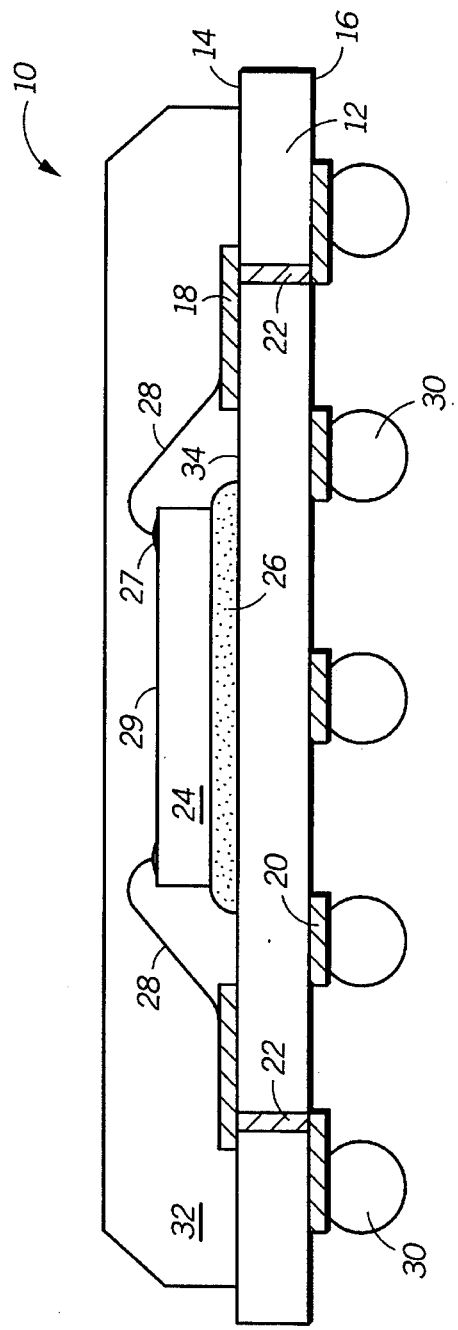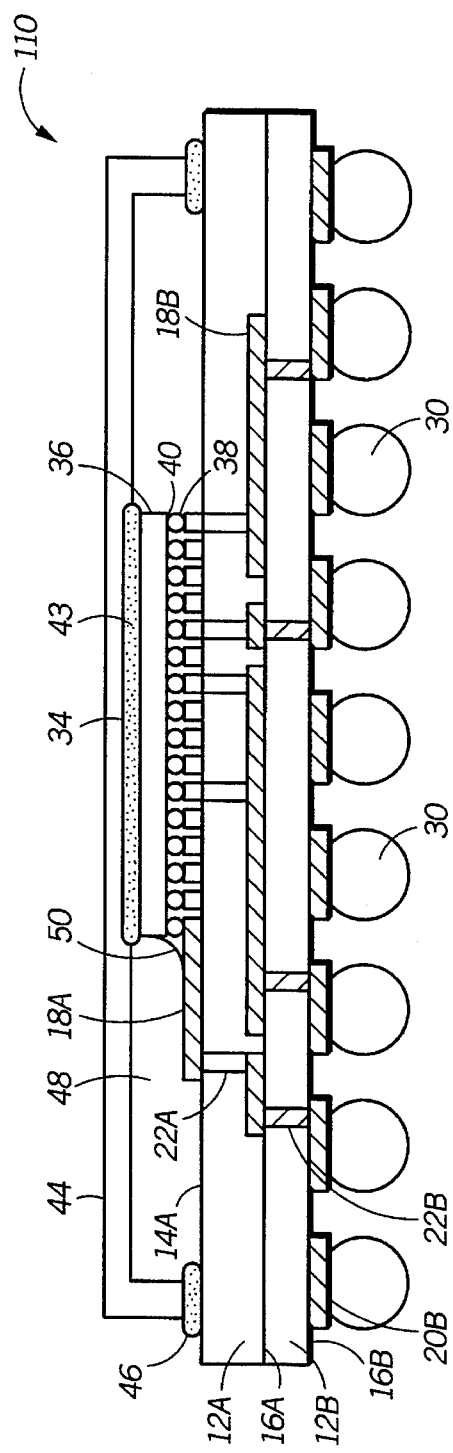

5,583,376

HIGH PERFORMANCE SEMICONDUCTOR DEVICE WITH RESIN SUBSTRATE AND METHOD FOR MAKING THE SAME

FIELD OF THE INVENTION

The present invention relates generally to semiconductor devices, and more specifically to high performance semiconductor devices having resin substrates and methods for making the same.

BACKGROUND OF THE INVENTION

In the fabrication of semiconductor devices, there is an on-going need to reduce packaging costs and improve the electrical and thermal performance of the packages. Satisfying these needs is particularly important for "high end" or high performance devices which require packages of tight specifications. For example, VLSI (very large scale integration) and ULSI (ultra large scale integration) semiconductor devices that require very fast signal processing demand packaging materials which have a low dielectric constant and low dissipation factor. One approach to meeting these requirements is by the use of a wiring or circuitized substrate instead of leads, for example a lead frame.

In one view, the dielectric constant of such a substrate should be around 2 or below, and the dissipation factor should be around 0.00025 or below. Substrate materials also need to have structural integrity, including good tensile, compressive and flexural strength properties and good chemical resistance to withstand the many assembly steps and environmental conditions to which the package is subjected. The requirements of a material for a printed circuit board (PCB) are less demanding, in part due to the much larger scale for PCBs, including increased thickness. It should be remembered that PCBs typically bear a relatively large number of already packaged devices. The materials used for PCBs would thus not likely be suitable for device circuitized substrates.

At the same time, it is desirable to keep packaging costs low. Accordingly, high performance substrate materials are preferably able to be fabricated using conventional processes, including molding, extrusion, and coating. Flexibility in manufacturing the material is also desirable, for example, the ability to be drilled, laminated, plated, etched, routed, etc. In surface mount applications, substrate materials should also have very low moisture absorption characteristics. Semiconductor devices made from materials which absorb water later crack or pop open as the absorbed water rapidly expands under conventional high temperature assembly techniques. In addition, it would be highly desirable if the substrate material used had relatively low material density to reduce the mass of the finished product.

Conventional materials used in commercial devices and circuit boards are proving to be less than desirable. Ceramic substrates are expensive and heavy. Also, the commonly used bis-maleimide triazine/epoxy resin blend (abbreviated as BT resin), which has been used in plastic ball grid arrays (PBGAs) has several properties which make it unsuited for high performance packages. BT resins have dielectric constants, $E_r$, of about 4.3, and dissipation factors of about 0.006. In addition, they absorb as much as 1 wt. % water when immersed in water for 24 hours at a temperature of 24° C. Thus, it would be desirable if a substrate material could be discovered which would meet the packaging requirements of fast, high performance semiconductor devices, while satisfying as many of the foregoing desirable properties as possible.

BRIEF DESCRIPTION OF THE DRAWINGS

The present invention is illustrated by way of example and not limitation in the figures of the accompanying drawings, in which like references indicate similar elements, and in which:

FIG. 1 is a cross-section of a plastic ball grid array semiconductor device where the terminals on the active surface of the die are wire bonded to conductive portions of a substrate and made in accordance with the present invention;

FIG. 2 is a cross-section of a plastic ball grid array semiconductor device with the semiconductor die mounted in a "flip-chip" manner, also in accordance with the invention;

DETAILED DESCRIPTION OF A PREFERRED EMBODIMENT

Figure 3:
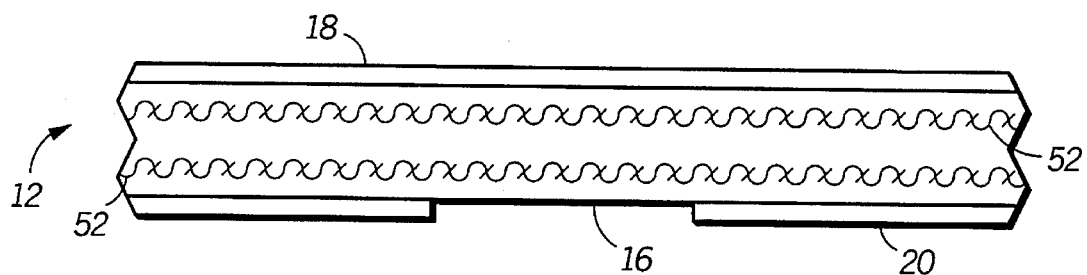
FIG. 3 is a cross-section of a polymethylpentene substrate of this invention having a woven fabric filler therein.

Generally, the present invention, in one embodiment, is a semiconductor device having a resin substrate with a top surface, a bottom surface, and a plurality of conductive vias between the top surface and bottom surface. More specifically, the resin substrate is polymethylpentene resin, which may or may not contain a filler. A semiconductor die is mounted to the top surface of the resin substrate and there is provided a way for electrically connecting the semiconductor die to the plurality of conductive vias. The semiconductor die and portions of the top surface of the resin substrate are encapsulated. A high performance semiconductor device of the present invention in one form is a plastic ball grid array (PBGA) where the semiconductor die is wire bonded or physically and electrically connected using a flip-chip or die chip attach (DCA) orientation.

The invention more precisely addresses a packaging solution for high performance semiconductor devices and their requirements. By "high performance" or "high end" is meant any semiconductor device that operates at 100 MHz or more and/or has a million or more transistors. Such high performance devices may include, but are not limited to, microprocessors, microcontrollers, math coprocessors, high density memory chips and the like. However, it is noted that the present invention's advantages can be used for the benefit of low end and less complex devices as well.

It has been discovered that polymethylpentene (PMP) thermoplastic resins satisfy high performance packaging needs. The PMP resins may be used alone or fabricated as a composite through techniques such as molding, extrusion, coating, etc. to incorporate various fillers such as woven fabrics and non-woven fibers, e.g. aramid, smectic liquid crystal polymers (LCPs), glass, and the like. Particulate fillers including, but not limited to, silica, glass spheres, talc, and other suitable materials may also be incorporated. The use of polymethylpentene resin will enhance the composite dielectric constant of the resulting high performance substrate. Excellent mechanical properties under thermal stress, and good chemical resistance of PMP resins further support use of this material as an advanced substrate material for high performance electronic packaging applications. Polymethylpentene has a low density, combined with good dielectric strength which can result in reduced material thickness and overall package bulk while providing superior electrical insulation. This in turn will help reduce impedance and crosstalk, thus enhancing overall signal quality and time of flight, i.e. signal speed processing.

These and other features, and advantages, will be more clearly understood from the following detailed description taken in conjunction with the accompanying drawings. It is important to point out that the illustrations may not necessarily be drawn to scale (for instance, some small features may have been exaggerated to show detail), and that there may be other embodiments of the present invention which are not specifically illustrated.

This invention entails the use of polymethylpentene (PMP), a thermoplastic resin with excellent electrical, mechanical and thermal properties as compared to more conventional resins, such as bis-maleimide triazine/epoxy resin blend (BT resin) and other thermosetting resins conventionally used for printed circuit boards. As will be seen, PMP may be molded with a variety of fillers or whatever is necessary to produce the appropriate mechanical and electrical properties. The material may be injection molded, laminated, compression molded, extruded, stamped, etc., because of its ease of processing. The resulting product also has the potential for recycling since thermoplastic materials can be reprocessed, unlike thermoset materials. Circuitry may be built on composite PMP materials in any of the ways currently used for PBGAs and related technologies, such as PCB manufacture.

Shown in FIG. 1, in cross-section, is one embodiment of a high performance semiconductor device, specifically a PBGA semiconductor device 10, having a resin substrate 12 which in bulk is polymethylpentene, having top surface 14, a bottom surface 16. There are also present a die receiving area 34 on the top surface 14, a first pattern of conductive traces 18 on the top surface 14 and a second pattern of conductive traces 20 on the bottom surface 16, along with a plurality of conductive vias 22 between the top surface 14 and the bottom surface 16, which electrically connect the first pattern of conductive traces 18 and the second pattern of conductive traces 20. Semiconductor die 24, which may be an integrated circuit, is conventionally mounted or positioned in the die receiving area 34 with a die attach material 26. In the FIG. 1 embodiment, semiconductor die 24 is electrically connected by its terminals 27 on active surface 29 via conventionally placed wire bonds 28 to first pattern of conductive traces 18 through conductive vias 22 and to second pattern of conductive traces 20 on the bottom surface 16 and to solder balls 30. Solder balls 30 are on the side of PBGA 10 to be used in mounting the PBGA to a printed circuit board or other substrate to be used in its ultimate assembly. Finally, a plastic body 32 is molded, formed or otherwise placed over the semiconductor die 24, the wire bonds 28 and at least a portion of the top surface 14 of resin substrate 12. It is permissible for resin substrate 12 to be overmolded, by which is meant that at least part of the edge of resin substrate 12 is encapsulated by the body 32, or substantially completely encapsulated, as long as solder balls 30 are left exposed for mounting the PBGA 10. The invention is not limited by any particular edge molding or edge treatment of resin substrate 12 in relation to plastic body 32.

By requiring that the bulk of resin substrate 12 be PMP is meant that the major resin component of the substrate 12 by volume be PMP, the balance of the resin substrate 12 volume being occupied by fillers (not shown in FIG. 1), conductive vias 22, laminates (not shown) or other components. Preferably, the plastic package material used in encapsulant or body 32 is selected so as to have a coefficient of thermal expansion (CTE) similar to the PMP substrate. The body 32 may be of conventional thermosetting materials, such as epoxy novolak resin, as long as the mechanical characteristics are compatible with PMP. Body 32 may be applied by "glop top" (non-molded) or molded techniques. It is permitted, though not necessary that the electrical characteristics of body 32 match those of PMP.

Solder balls 30 are formed from a lead-tin alloy having about a 60:40 lead-tin composition, or alternatively, a lead-tin-silver alloy having about a 62:36:2 composition or an indium alloy, or the like. Solder balls 30 are somewhat resilient and can absorb mechanical stress when resin substrate 12 is mounted on another substrate, such as a PCB or the like. Furthermore, solder is a compliant material and can be shaped by application of heat and pressure to form various thermal configurations, such as a column, barrel or alternatively, an hour-glass configuration. Solder joint fatigue is a frequently encountered problem when plastic ball grid array packages such as 10 are mounted to a PCB. This problem is minimized in the present invention by using the PMP substrate material to construct resin substrate 12 which can be matched to have a similar coefficient of thermal expansion as the PCB (not shown).

First and second conductive patterns 18 and 20 may be formed on resin substrate 12 by laminating sheets of copper to both top and bottom surfaces 14 and 16, respectively. Next, vias 22 are drilled through the laminated copper sheets and resin substrate 12, and copper is plated to the sides of the vias 22. The patterns of traces are formed on both surfaces of resin substrate 12 by sequentially photolithographically masking and etching the laminated copper sheets. Fabrication of conductive patterns 18 and 20 on both surfaces 14 and 16 of resin substrate 12 enables the formation of a wide range of electrical coupling configurations between semiconductor device 10 and a PCB. For example, a number of different types of electronic components such as microprocessors, microcontrollers, static and dynamic memory devices, standard logic devices, applications specific integrated circuits and the like having a variety of bonding pad configurations can be attached to resin substrate 12 and bonded to a customized pattern of lead traces having a layout custom designed to provide optimal signal transmission characteristics for the particular device and bond pad configuration thereon. Further, the specific configuration of second pattern of conductive traces 20 can be designed to electrically couple semiconductor die 24 to lands on a PCB arranged in a regular square array, or alternatively, a customized, irregular array.

In certain applications, it may be advantageous to route conductive patterns on resin substrate 12 under semiconductor die 24 to an internal conductive via 22. While this may be accomplished using a single resin substrate 12, it may also be accomplished as shown in FIG. 2 which illustrates another non-limiting embodiment as PBGA 110 which has two resin substrates 12A and 12B bonded together. Resin substrate 12A has first conductive pattern 18A on the top surface 14A thereof. Resin substrate 12B has first conductive pattern 18B which may also serve as second conductive pattern 20A on the bottom surface 16A of resin substrate 12A. Resin substrate 12B has second conductive pattern 20B on the bottom surface 16B thereof.

First conductive pattern 18A on top surface 14A of resin substrate 12A is electrically and physically connected to first conductive pattern 18B by conductive vias 22A; similarly, first conductive pattern 18B on top surface 14B of resin substrate 12B is physically and electrically connected to second conductive pattern 20B by conductive vias 22B. More than two resin substrates 12 may be used in multilevel fashion along with accompanying conductive patterns and conductive vias within the scope of this invention.

Also shown in FIG. 2 is an alternative way of physically and electrically connecting semiconductor die 36 onto resin substrate 12, i.e. by inverting the die 36 in "flip-chip" or direct chip attach (DCA) fashion. Semiconductor die 36 has a plurality of controlled collapse chip connections or conductive bumps 38 directly placed on bonding pads (not shown) on the active surface 40 of semiconductor die 36. Conductive bumps 38, which may be solder, as previously described, gold, or other suitable material, directly bond die 36 to first conductive pattern 18A in an inverted position. In the FIG. 2 embodiment, thermal grease 43 permits the more efficient transfer of heat from die 12 to the inner surface of cap or lid 44 to aid in heat dissipation. Lid 44 may be made of aluminum or other suitable material. Lid 44 covers at least a portion of and is attached to substrate 12A by lid bonds 46, which completely seals semiconductor die 36 inside cavity 48 formed by resin substrate 12A and lid 44.

Again, it will be appreciated that in the FIG. 2 embodiment of the high performance plastic ball grid array 110 both resin substrates 12A and 12B are in bulk PMP which may contain one or more fillers, not shown in FIG. 2. Underfill 50 may be used around conductive bumps 38 to seal these bonds from possible corrosive or chemical attack. It should be noted that the flip-chip or DCA embodiment depicted in FIG. 2 is not limited to a multi-layer resin substrate 12, but may be used with a single resin substrate 12 as shown in FIG. 1. Similarly, the wire-bonded embodiment of the invention depicted in FIG. 1 is not necessarily limited to the single resin substrate 12 shown therein, but may be used together with multi-layer resin substrates such as that depicted in FIG. 2.

Figure 4:
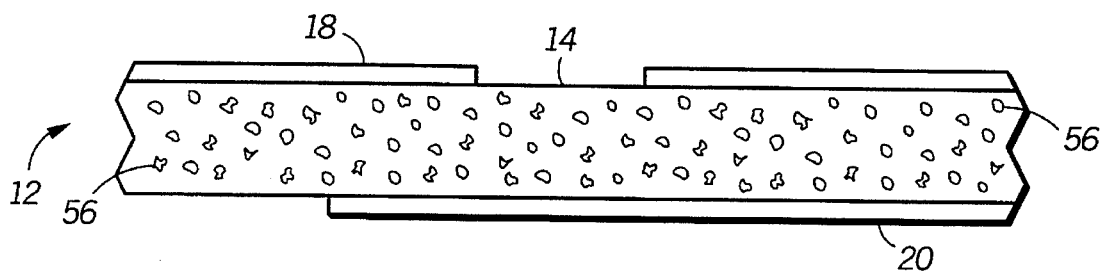
FIG. 4 is a cross-section of a polymethylpentene substrate of this invention having a particulate filler therein.
Figure 5:
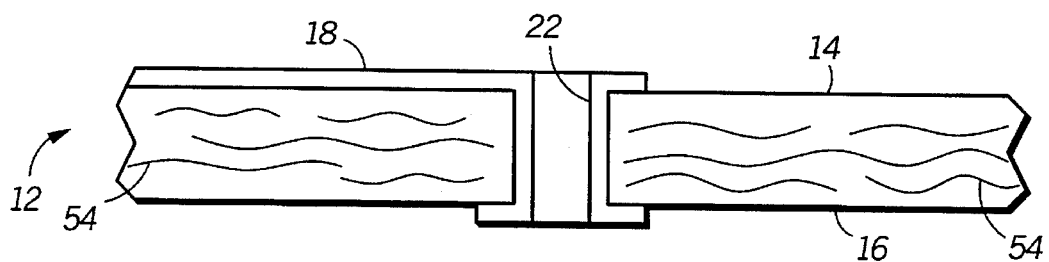
FIG. 5 is a cross-section of a polymethylpentene substrate of this invention having a non-woven fiber filler therein.

Seen in FIG. 3 is a cross-section of a resin substrate 12 in accordance with the present invention having fiber mats or woven fabrics 52, such as glass or aramid, smectic LCPs and the like, placed therein to enhance the physical properties of the substrate, such as tensile, compressive and flexural strengths. Individual fibers 54 of these fillers may also be used as fillers in a resin substrate as seen in FIG. 5. Furthermore, particulate fillers 56, including, but not limited to silica, glass spheres, talc, etc. may also be placed in resin substrate 12 as shown in FIG. 4, though not to scale. It will be appreciated that these various fillers 52, 54, and 56 may be used alone or together in a particular resin substrate 12 to combined advantage. Conventional techniques may be used in placing the fillers in the substrates. For example, for particulate fillers, the particulate may be added to the liquid polymer and the substrate formed by standard extrusion techniques. If woven fabrics or webs are used, a coextrusion process would have to be employed.

Further with respect to polymethylpentene, it is a high melting point (240° C.) crystalline thermoplastic resin that can be subjected to forming, circuit fabrication and subsequent assembly processes without distortion. Materials made from PMP have retention of form stability to near their melting points. Most advantageously, PMP has a dielectric constant of 2.12 which will enhance signal propagation in high performance devices. It has a volume resistivity close to that of polytetrafluoroethylene polymers, or >$10^{16}$ ohm-cm. PMP has a dissipation factor of 0.000025 (according to ASTM D 150, 60 Hz), and a dielectric strength of 700 V/mil, in ⅛-inch thick sample.

Polymethylenepentene has a coefficient of thermal expansion (CTE) of 11.7 in./in./°C.×$10^{-5}$. CTE control can be accomplished in the same manner as most filled resins such as generic grade FR-4 and BT/epoxy blends for packaging applications. Smectic LCPs are particularly recommended for large substrates and high end applications. Liquid crystal polymers are preferred fillers because they are useful in lowering the CTE of the resins to match that of the other packaging materials. Additionally, LCPs have good dielectric properties.

In addition, PMP is quite transparent and has a light transmission value of 90%, and thus would be useful in high performance optical electronics. Dyes and colored fillers may be used where this property is not considered desirable. As noted, the resin retains some useful mechanical properties at high temperatures, form retention being of great interest. PMP further has a material density (specific gravity) of 0.83, close to the theoretical minimum for thermoplastic materials. Also, PMP has excellent chemical resistance to most of the commonly used substrate fabrication and assembly process chemicals.

Although polymethylpentene is the polymer most specifically identified as that useful in this invention due to its availability, it is anticipated that other polyalkylalkylenes may also be useful polymers for substrates in high performance devices. For example, materials such as polyethylpentene, polymethylbutene, polymethylhexene and the like are anticipated as likely candidates for success in the resin substrates of the invention.

Shown in Table I is a comparison of the physical and mechanical properties of polymethylpentene with those of bis-maleimide triazine/epoxy resin blend (BT resin), which is a commonly used PBGA substrate material. It will be seen that PMP has properties that render it much more suitable for high performance semiconductor devices.

TABLE I

| Physical and Mechanical Properties Polymethylpentene v. BT resin | | | |
|---|---|---|---|
| Property | PMP | BT/epoxy resin | Notes |
| Glass transition temp., °C., Tg* | 240 | 180 | |
| Dielectric constant, $E_r$* | 2.1 | 4.3 | |
| Dissipation factor* | 0.000025 | 0.005 | |
| Volume resistivity* | $10^{16}$ Ω-cm | $10^{15}$ Ω-cm | |
| Melting point | 240° C., thermoplastic | thermoset ∴ n/a | |
| Moisture absorption | ≤0.01 | 1.00 | wt %, immersed for 24 hrs. at 24° C. |
| Specific gravity | 0.83 | >1.0 | |
| Temperature resistance | 160° C. | 160–230° C. | Comparable |

*ASTM D150, 1 MHz

Some physical and material properties were obtained from C. A. Harper, ed., *Handbook of Plastics and Elastomers, and Plastics,* 9th ed., International Plastics Selector.

As evident from the table, BT resins have inferior moisture absorption values, indeed they absorb about 100 times as much moisture as polymethylpentene. Particularly important for high performance semiconductor devices is the fact that polymethylpentene has superior material properties for electronics applications. For example, note that the dielectric constant, $E_r$, of PMP at 2.1 is half that of BT resin at 4.3.

Even with the addition of fillers, the $E_r$ of a PMP substrate is likely to be no more than about 2.3, and preferably between about 1.9 and 2.3. Similarly, the dissipation factor of PMP is 0.000025, far below the 0.006 reported for BT resin. The reduced density of PMP also gives an advantage over BT resins, permitting the fabrication of reduced mass parts.

A similar comparison of mechanical and physical properties between PMP and other PCB resins such as polytetrafluoroethylene and cyanate ester-type materials will demonstrate the superiority of PMP for these demanding, high performance applications.

The foregoing description and illustrations contained herein demonstrate many of the advantages associated with the present invention. In particular, it has been revealed that a high performance semiconductor device made using a resin substrate in bulk of polymethylpentene has significant physical and electrical advantages. In particular, devices made using a PMP resin substrate will have both a low dielectric constant and a low dissipation factor, even when fillers are present. Yet another advantage is that the present invention provides semiconductor devices with low moisture absorption.

Thus it is apparent that there has been provided, in accordance with the invention, a high performance or "high end" semiconductor device that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the molecular weight of PMP could be modified to advantage within the scope of this invention, though a particular advantageous range might not be explicitly disclosed herein. In addition, the invention is not limited to the particular physical depictions of high performance devices illustrated. It is also important to note that the present invention is not limited in any way to using PMP only in a flat resin substrate, that it may find use in other parts of a high performance device, such as the overmolding or lid materials. Furthermore, it is anticipated that chemical homologs of polymethylpentene may find utility in the fabrication of high end devices. Therefore, it is intended that this invention encompass all such variations and modifications as fall within the scope of the appended claims.

We claim:

1. A semiconductor device comprising:

a resin substrate having a top surface, a bottom surface, a conductive wiring pattern on the top surface, and a plurality of conductive vias between the top surface and bottom surface electrically connected to the conductive wiring pattern, wherein the resin substrate comprises polymethylpentene resin;

a semiconductor die mounted to the top surface of the resin substrate;

means for electrically connecting the semiconductor die to the conductive wiring pattern and the plurality of conductive vias; and resin encapsulating means for encapsulating the semiconductor die and portions of the top surface of the resin substrate.

2. The device of claim 1 wherein the resin substrate further comprises a mechanical filler selected from a group consisting of woven fabrics, non-woven fibers, and particulates.

3. The device of claim 2 wherein the mechanical filler is comprised of liquid crystal polymer fibers.

4. The device of claim 2 wherein the mechanical filler is comprised of glass.

5. The device of claim 1 wherein the semiconductor die is flip-chip mounted to the resin substrate, and the means for electrically connecting comprises a plurality of conductive bumps formed on an active surface of the semiconductor die.

6. The device of claim 1 wherein the means for electrically connecting comprises wire bonds.

7. The device of claim 1 wherein the resin substrate has a dielectric constant, $E_r$, between about 1.9 and about 2.3 and a moisture absorption of about 0.01% or less after immersion for 24 hours at 24° C.

8. The device of claim 1 further comprising a plurality of resin substrates of polymethylpentene resin, each having a top surface, a bottom surface and a plurality of conductive vias where the conductive vias of the resin substrates are electrically connected together.

9. A semiconductor device comprising:

a substrate comprising polymethylpentene resin and mechanical filler, the substrate having a top surface, a bottom surface, a die receiving area on the top surface, a first pattern of conductive traces formed on the top surface, a second pattern of conductive traces formed on the bottom surface, and plurality of conductive vias between the top surface and bottom surface and electrically conducting the first pattern of conductive traces to the second pattern of conductive traces;

a semiconductor die positioned in the die receiving area;

a plurality of wire bonds electrically connecting the semiconductor die to the first pattern of conductive traces;

an epoxy resin encapsulant which covers the semiconductor die, the plurality of wire bonds, and a portion of the top surface of the substrate; and a plurality of solder balls joined to the second pattern of conductive traces on the bottom surface of the substrate and electrically coupled to the plurality of conductive vias.

10. The device of claim 9 wherein the mechanical filler is selected from a group consisting of woven fabrics, non-woven fibers, and particulates.

11. The device of claim 10 wherein the mechanical filler comprises liquid crystal polymer fibers.

12. The device of claim 10 wherein the mechanical filler comprises glass.

13. The device of claim 9 wherein the epoxy resin encapsulant is a molded epoxy resin encapsulant.

14. A high performance semiconductor device requiring a substrate having a dielectric constant, $E_r$, between about 1.9 and about 2.3 and a moisture absorption of about 0.01% or less after immersion for 24 hours at 24° C. comprising:

a substrate comprising polymethylpentene resin and mechanical filler, the substrate having a top surface, a bottom surface, a die receiving area on the top surface, a first pattern of conductive traces formed on the top surface, a second pattern of conductive traces formed on the bottom surface, and a plurality of conductive vias between the top surface and the bottom surface and electrically conducting the first pattern of conductive traces to the second pattern of conductive traces; wherein the mechanical filler is selected from a group consisting of woven fabrics, non-woven fibers, and particulates a semiconductor die positioned in the die receiving area;

a plurality of wire bonds electrically connecting the semiconductor die to the first pattern of conductive traces;

an epoxy resin encapsulant which covers the semiconductor die, the plurality of wire bonds, and a portion of the top surface of the substrate; and a plurality of solder balls joined to the second pattern of conductive traces on the bottom surface of the substrate and electrically coupled to the plurality of conductive vias.

* * * * *